(12) United States Patent
Antoine et al.

(10) Patent No.: US 8,241,931 B1
(45) Date of Patent: Aug. 14, 2012

(54) METHOD OF FORMING MEMS DEVICE WITH WEAKENED SUBSTRATE

(75) Inventors: Christophe Antoine, Cambridge, MA (US); John R. Martin, Foxborough, MA (US)

(73) Assignee: Analog Devices, Inc., Norwood, MA (US)

(*) Notice: Subject to any disclaimer, the term of this patent is extended or adjusted under 35 U.S.C. 154(b) by 17 days.

(21) Appl. No.: 12/899,292

(22) Filed: Oct. 6, 2010

Related U.S. Application Data

(60) Provisional application No. 61/252,821, filed on Oct. 19, 2009.

(51) Int. Cl.
*H01L 21/00* (2006.01)
(52) U.S. Cl. .......................... 438/22; 438/48
(58) Field of Classification Search .................. None
See application file for complete search history.

(56) References Cited

U.S. PATENT DOCUMENTS

| | | | |
|---|---|---|---|
| 5,374,564 A | 12/1994 | Bruel | 437/24 |
| 5,882,987 A | 3/1999 | Srikrishnan | 438/458 |
| 6,430,109 B1 | 8/2002 | Khuri-Yakub et al. | 367/181 |
| 6,958,255 B2 | 10/2005 | Khuri-Yakub et al. | 438/48 |
| 7,348,257 B2 | 3/2008 | Barlocchi et al. | 438/456 |
| 7,545,075 B2 | 6/2009 | Huang et al. | 310/309 |
| 2008/0296708 A1* | 12/2008 | Wodnicki et al. | 257/414 |
| 2011/0073967 A1 | 3/2011 | Yang et al. | 257/416 |
| 2011/0075865 A1 | 3/2011 | Yang et al. | 381/174 |

OTHER PUBLICATIONS

Andre Auberton-Herve et al., "Smart Cut Process Technique—An Overview," Electronic Design, Online ID #3400, 2 pages, May 12, 2003.

Arif Sanh Ergun et al., "Capacitive Micromachined Ultrasonic Transducers: Fabrication Technology," IEEE Transactions on Ultrasonics, Ferroelectrics, and Frequency Control, vol. 52, No. 12, pp. 2242-2258, Dec. 2005.

Peng Cong et al., "Single crystal 6H-SiC MEMS fabrication based on smart-cut technique," Journal of Micromechanics and Microengineering, vol. 15, pp. 2243-2248, 2005.

* cited by examiner

*Primary Examiner* — Seahvosh Nikmanesh
(74) *Attorney, Agent, or Firm* — Sunstein Kann Murphy & Timbers LLP

(57) ABSTRACT

A method of producing a MEMS device provides a first substrate having a first interior surface and thickness, and a second substrate having a second interior surface. The method also forms at least one closed wall on at least one of the first and second substrates, weakens the first substrate in a plane generally parallel to the first interior surface, and secures the first substrate to the second substrate. The at least one closed wall extends between the first interior surface and the second interior surface. The method further separates a portion of the first substrate along the plane generally parallel to the first interior surface after securing the first and second substrates, and removes an excess portion of the first substrate to produce a reduced thickness first substrate of no greater than about 20 microns.

23 Claims, 5 Drawing Sheets

METHOD OF FORMING MEMS DEVICE WITH WEAKENED SUBSTRATE

PRIORITY

This patent application claims priority from provisional U.S. patent application No. 61/252,821, filed Oct. 19, 2009, entitled, "METHOD OF FORMING MEMS DEVICE WITH WEAKENED SUBSTRATE AND MEMS DEVICE WITH SINGLE SIDE INTERFACE," and naming Christophe Antoine and John R. Martin as inventors, the disclosure of which is incorporated herein, in its entirety, by reference.

FIELD OF THE INVENTION

The invention generally relates to MEMS device and, more particularly, the invention relates to using weakened substrates to form MEMS devices.

BACKGROUND OF THE INVENTION

Electrostatic MEMS devices typically have at least one variable capacitor formed by two opposed plates. Many types of such MEMS devices operate most effectively when the spacing between the two plates is substantially uniform. Capacitive micromachined ultrasonic transducers ("CMUTs") are a good example of this phenomenon.

Maintaining uniform spacing is especially challenging, however, when using conventional micromachining techniques. Specifically, sacrificial release processes commonly used in micromachining technologies often yields irregular spacing between the CMUT capacitor plates. The art has responded to this problem by fabricating CMUTs with very uniform and expensive silicon-on-insulator wafers ("SOI wafers"). Undesirably, however, this process wastes much of the SOI wafer, undesirably increasing fabrication costs.

SUMMARY OF THE INVENTION

In accordance with one embodiment of the invention, a method of producing a CMUT device provides a first substrate having a first interior surface and thickness, and a second substrate having a second interior surface. As provided, the first substrate is weakened in a plane that is generally parallel to its first interior surface. The method also forms at least one closed wall on at least one of the first and second substrates, and secures the first substrate to the second substrate. The at least one closed wall extends between the first interior surface and the second interior surface. The method further separates a portion of the first substrate along the plane generally parallel to the first interior surface after securing the first and second substrates, and removes an excess portion of the first substrate to produce a reduced thickness first substrate of no greater than about 20 microns.

Some embodiments cleave the first substrate to a thickness of no greater than about 5 microns. Moreover, the at least one closed wall may form a closed chamber with a vacuum.

The method also may form a plurality of closed walls on at least one of the first and second substrates to effectively form an array of CMUTs. For example, the method may form a plurality of first plates on the first substrate, and a plurality of second plates on the second substrate. Each of the plurality of first plates is defined by one of the plurality of walls, while each second plate forms a capacitive element with one of the first plates. The first plates are electrically isolated from the second plates. In addition, the method may form a plurality of electrical contacts on the second substrate to electrically interconnect with the first and second plates.

The method may secure the substrates by electrically connecting the at least one closed wall with both the first interior surface and the second interior surface. In addition, the method may form first and second vias through the second substrate, electrically connect the first via to the first substrate, and electrically connect the second via to the second substrate.

In a manner similar to other embodiments, the method may form a first plate on the first substrate, and form a second plate on the second substrate to form a capacitive element. Thus, the first and second plates are electrically isolated. To those ends, the method may form an insulating region around the second plate to isolate it from the first plate.

In accordance with other embodiments of the invention, a method of producing a MEMS device provides a first substrate having a first interior surface and a thickness, and a second substrate having a second interior surface and a micromachined plate. The method also forms a plurality of walls on at least one of the first and second substrates, weakens the first substrate in a plane generally parallel to the first interior surface, and secures the first substrate to the second substrate. The plurality of walls extends between the first interior surface and the second interior surface so that each wall separates a first plate on the first substrate from a second plate on the second substrate. Each first and second plate pair is configured to form a capacitive element. Furthermore, the method electrically isolates the first plate of each capacitive element from the second plate of its capacitive element and, after securing the two substrates, cleaves a portion of the first substrate along the plane generally parallel to the first interior surface. Cleaving reduces the thickness of the first substrate to no greater than about 20 microns. Finally, the method removes an excess portion of the first substrate to produce the reduced thickness first substrate.

In accordance with another embodiment of the invention, a MEMS device has flexible and rigid substrates, and a conductive, closed wall extending between the two substrates. The closed wall, flexible substrate and rigid substrate form a chamber (e.g., under vacuum), while conductive bonding material mechanically bonds the flexible substrate to the rigid substrate by the closed wall—forming a bonded CMUT. The conductive bonding material also electrically connects the flexible substrate with the rigid substrate.

The rigid substrate may have first and second electrodes. The first electrode is electrically connected with the flexible substrate by the closed wall, and the second electrode is electrically insulated from the first electrode. In illustrative embodiments, the first and second electrodes are generally co-planar. The MEMS device also may have a plurality of electrical connectors formed on the rigid substrate. The electrical connectors electrically connect with the flexible and rigid substrates. This plurality of electrical connectors may be a conductive trace and/or a pad.

The MEMS device may have a plurality of vias formed on the rigid substrate. The plurality of vias electrically connects with the flexible and rigid substrates.

In accordance with other embodiments, a MEMS device has a flexible substrate, a rigid substrate, and a unitary, conductive wall extending between the flexible and rigid substrates. In addition, the MEMS device also has conductive bonding material electrically connecting the wall to at least one of the rigid substrate and the flexible substrate. The conductive bonding material bonds the flexible substrate to the rigid substrate, by the wall, to form a bonded pressure/sound transducer. This conductive bonding material electrically connects the flexible and rigid substrates.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a fabrication method produces a MEMS device by securing a weakened (diaphragm) wafer to a second wafer, and then cleaving the weakened primary wafer. Accordingly, this technique should produce a substantially uniform and thin diaphragm wafer, similar to those found in the device layer of a silicon-on-insulator wafer.

In other embodiments, a MEMS device, such as a capacitive micromachined ultrasonic transducer, conductively bonds a conductive wall between its two opposing substrates. Accordingly, both substrates are electrically accessible through one of the two substrates. Details of illustrative embodiments are discussed below.

Figure 1A:
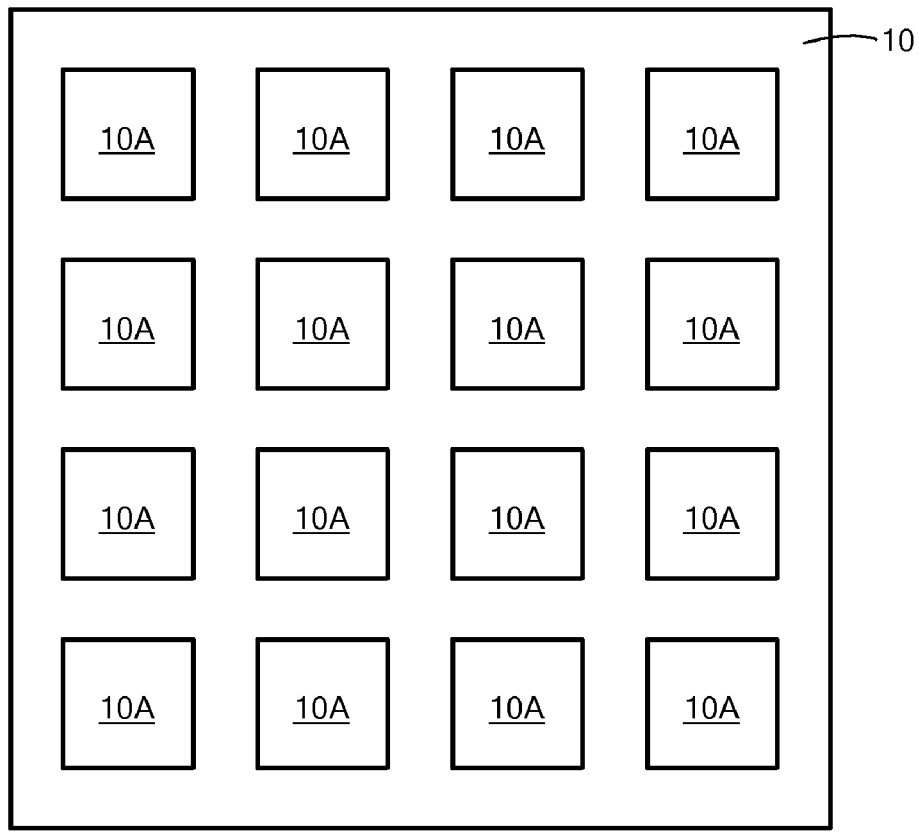
FIG. 1A schematically shows a plan view of a ultrasonic transducer chip that may implement illustrative embodiments of the invention.

FIG. 1A schematically shows a plan view of a MEMS device 10 that may implement illustrative embodiments of the invention. Specifically, the MEMS device 10 is an ultrasonic transducer chip (also identified by reference number '10") that may be used in a number of different applications. For example, the ultrasonic transducer chip 10 may be positioned in the scanning head of an ultrasound probe used for prenatal imaging of a growing fetus or for cardiac imaging. Accordingly, as known by those in the art, the transducer chip 10 transmits and receives ultrasonic signals reflected from an object of interest (e.g., the noted fetus or the chambers of the heart). On chip or off-chip circuitry (not shown) processes the reflected signals to produce an image, which, among other things, can be displayed on a display device, or stored in a database.

To those ends, the ultrasonic transducer chip 10 has a plurality of acoustic elements 10A that cooperate to produce image data used to produce an image. As an example, the acoustic transducer chip 10 shown in FIG. 1A has a two-dimensional array of four-by-four, or sixteen acoustic elements 10A. Alternatively, the transducer chip 10 may have a single one-dimensional array of acoustic elements 10A.

Those skilled in the art should understand that the transducer chip 10 can have many more acoustic elements 10A, or fewer acoustic elements 10A. Accordingly, discussion of the specific two-dimensionally array transducer chip 10 of FIG. 1A is not intended to limit various embodiments of the invention.

Figure 1B:
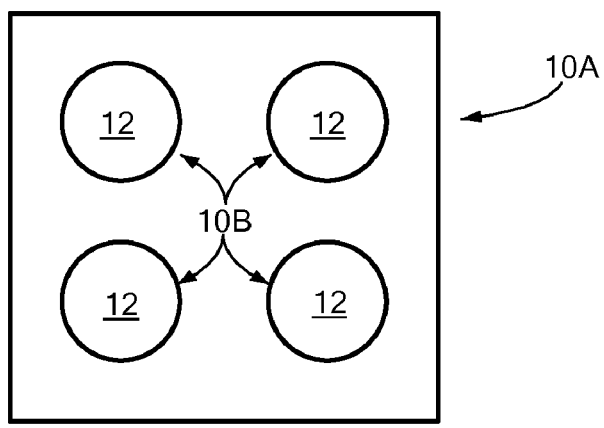
FIG. 1B schematically shows a plan view of an acoustic element implemented on the transducer chip of FIG. 1A.

FIG. 1B schematically shows a plan view of a single acoustic element 10A of the acoustic chip 10. As shown, the acoustic element 10A has four capacitive elements 10B that each are formed from a pair of capacitive plates 12 and 14 (discussed below and shown in subsequent figures). Because it is a plan view, FIG. 1B simply shows the top plates/flexible diaphragms 12 and thus, not the opposing bottom plates 14.

In a manner similar to the ultrasonic transducer chip 10 of FIG. 1A, those skilled in the art should understand that the acoustic element 10A can have many more or fewer capacitive elements 10B. In addition, those capacitive elements 10B can be one or two dimensional arrays. For example, a two-dimensional array can have tightly packed capacitive elements 10B that overlap, or capacitive elements 10B that are spaced apart as shown in FIG. 1B.

Figure 2:
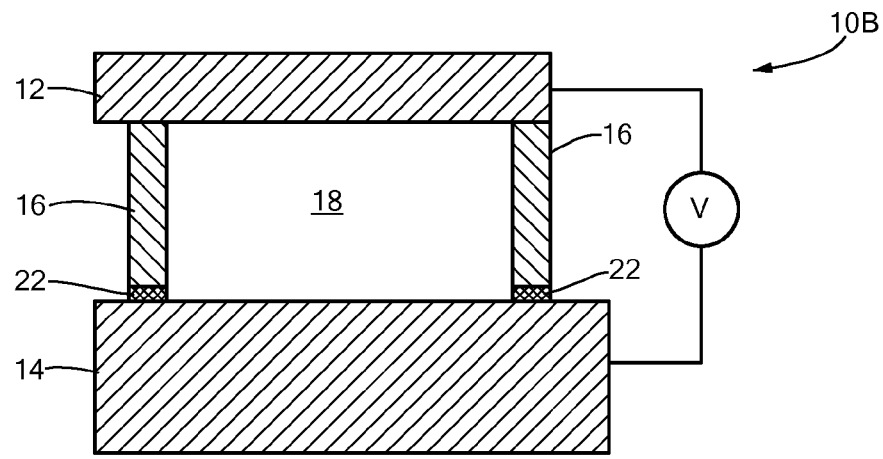
FIG. 2 schematically shows a generalized, cross-sectional view of a MEMS device that may implement illustrative embodiments of the invention.

FIG. 2 schematically shows a generalized, cross-sectional view of a capacitive element 10B that may implement illustrative embodiments of the invention. It should be noted that this capacitive element 10B of FIG. 1B and other discussed capacitive element embodiments may be referred to as a capacitive micromachined ultrasonic transducer (referred to herein as a "CMUT"). Although the term "CMUT" also may generically refer to the chip 10 or acoustic elements 10A of FIG. 1A, its use in this description is primarily focused on the capacitive element 10B.

In addition, some embodiments apply to other MEMS devices, such as microphones, pressure sensors, accelerometers, gyroscopes, etc. . . . Accordingly, discussion of acoustic elements, CMUTs, etc. . . . should not limit all embodiments of the invention.

As noted, the capacitive element 10B, which generates an ultrasonic signal when excited by a voltage or current, also can receive an ultrasonic signal. To those ends, as shown in FIG. 2, the capacitive element 10B forms a variable capacitor with the above mentioned flexible diaphragm 12 (a/k/a "top plate 12") and opposing stationary substrate 14 (a/k/a "bottom plate 14"). As noted above, FIG. 1B shows the flexible diaphragm 12 only and thus, does not show the stationary substrate 14. In accordance with illustrative embodiments, a closed, conductive wall 16 physically and electrically connects the diaphragm 12 and substrate 14. In fact, the wall 16, substrate 14, and diaphragm 12 together form a sealed chamber 18 under a substantial vacuum.

Application of a predefined, variable potential difference between the diaphragm 12 and substrate 14 causes the diaphragm 12 to vibrate, thus producing the noted ultrasonic signal. Conversely, receipt of an ultrasonic signal on the diaphragm 12 can cause it to vibrate in a corresponding manner, thus generating a corresponding variable capacitance. Conventional detection and conversion circuitry (not shown) may convert this resulting variable capacitance into data that can be used for any number purposes, such as for generating an image of a baby before birth.

Figure 3:
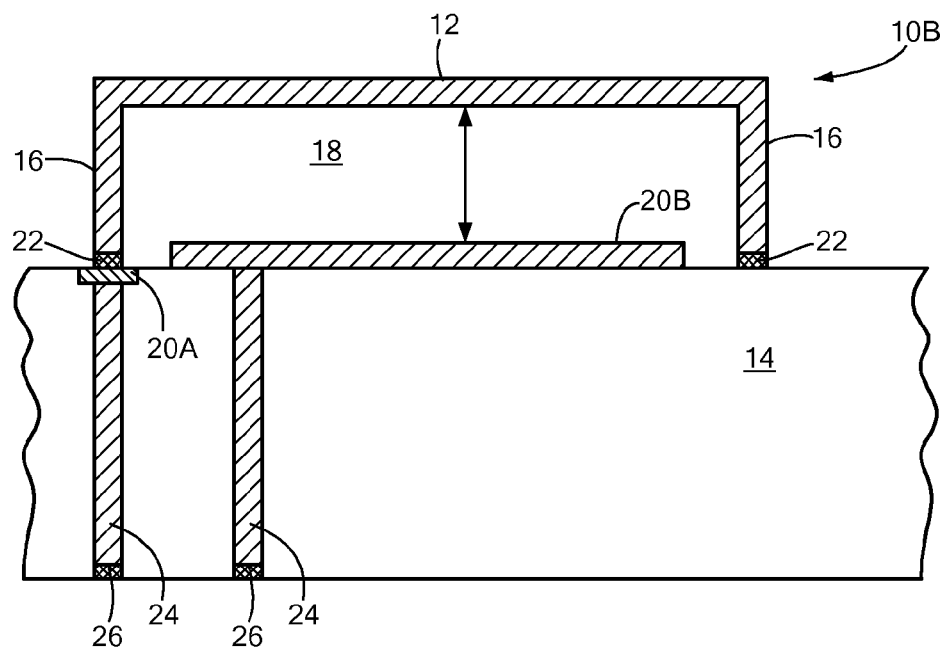
FIG. 3 schematically shows a more specific, cross-sectional view of a capacitive micromachined ultrasonic transducer implementing illustrative embodiments of the invention.

FIG. 3 schematically shows a more specific, cross-sectional view of a capacitive element 10B implementing illustrative embodiments of the invention. Specifically, as shown more generally in FIG. 2, this embodiment of the capacitive element 10B has the noted flexible diaphragm 12, which is electrically connected to a first electrode 20A on the substrate 14 by means of the conductive wall 16. A conductive bond 22 electrically and mechanically secures the bottom of the wall 16 to the substrate 14 to provide this connection.

A second electrode 20B integrated on the substrate 14 forms the variable capacitor with the diaphragm 12. Accordingly, both the diaphragm 12 and second electrode 20B are electrically isolated from each other and, as noted above, are referred to herein as "plates" or "capacitive plates." Both the first and second electrodes 20A and 20B thus are positioned directly on the substrate 14 but electrically insulated from one another. In this embodiment, conductive paths 24—vias 24—through the substrate 14 electrically connect the two electrodes 20A and 20B with pads 26 on the bottom side of the substrate 14.

The diaphragm 12 and substrate 14 can be formed from silicon, such as single crystal silicon wafers. Alternatively, the diaphragm 12 and substrate 14 can be formed from other materials, such as a silicon carbide or alumina. In a similar manner, the conductive wall(s) 16 may be formed from doped polysilicon or metals deposited on the surface of the substrate 14 or diaphragm 12 through conventional micromachining processes, or the same material as the diaphragm 12 or substrate 14. For example, the conductive wall 16 may be formed by etching a recess in the wafer forming the diaphragm 12, the substrate 14, or both the diaphragm 12 and substrate 14. Some embodiments, however, form the walls 16 from insulative material.

The electrodes 20A and 20B may be formed from deposited metals, doped silicon, or other material. In either case, the substrate 14 also may have additional components, such as additional microstructure (not shown) or circuitry (not shown).

Alternative embodiments can have different types of capacitive plates for the capacitive elements 10B. For example, micromachining processes may form a plurality of bottom plates (also identified by reference number "14") directly in the substrate 14. These bottom plates 14 therefore may be formed primarily from the same material as the substrate. Accordingly, if the substrate is formed from silicon, it should be appropriately doped to ensure appropriately conductive bottom plates 14. In this case, each of the bottom plates 14 may have insulation material to electrical isolate it from other bottom plates 14. To that end, each bottom plate 14 may have a nitride or oxide insulating layer circumscribing it in the substrate.

In illustrative embodiments, the array of bottom plates 14 may be set to a prescribed voltage, while the array of top plates 12 may be set to ground. Alternatively, the bottom plates 14 may be grounded and the top plates 12 may be set to a prescribed voltage. Of course, to operate properly, the plates 12 and 14 must be at different potentials.

As known by those skilled in the art, the distance between the diaphragm 12 and the substrate 14 should be is close to substantially constant as possible across the interior surfaces. For example, the distance between the bottom surface of the diaphragm 12 (from the perspective of the drawings) and the top surface of the substrate 14 may be between about 10-5000 nanometers. The tolerance permitted from this spacing across the entire diaphragm 12 and substrate 14 preferably is very small, such as on the order of a few nanometers. As discussed below, illustrative embodiments use certain techniques in an effort to accomplish these low tolerances.

Those skilled in the art can select appropriate materials and spacing for the different components. Accordingly, the materials and spacing discussed above are illustrative and not intended to limit various embodiments of the invention.

Figure 4:
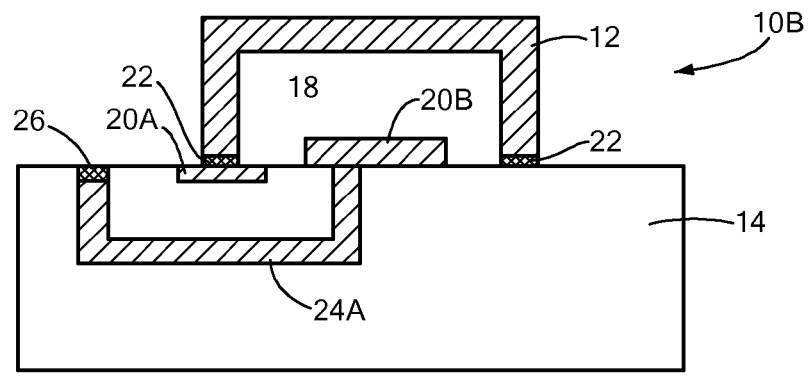
FIG. 4 schematically shows a cross-sectional view of a capacitive micromachined ultrasonic transducer implementing other embodiments of the invention.
Figure 5A:
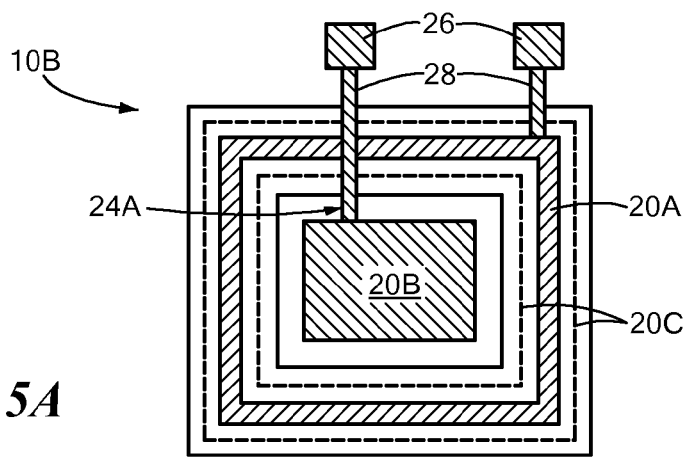
FIG. 5A schematically shows a top view, with one plate removed, of another embodiment of the invention.
Figure 5B:
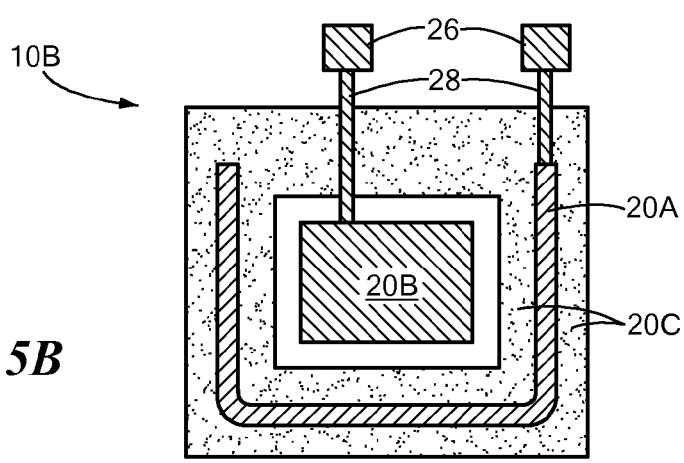
FIG. 5B schematically shows a top view, with one plate removed, of an alternative embodiment of the invention.

Rather than use the vias 24 to electrically connect with the first and second electrodes 20A and 20B, other embodiments simply use interface pads 26 and corresponding conductive traces 28 on the top surface of the substrate 14. For example, FIG. 4 schematically shows a conductive underpass 24A extending from electrode 20B to an interface pad 26 on the top surface of the substrate 14. FIG. 5A schematically shows a top view of this embodiment (with the diaphragm 12 removed), which uses conductive traces 28 to interconnect with interface pads 26 on the top surface of the substrate 14. One pad 26 and trace 28 connect with electrode 20A, while another pad 26 and trace 28 connect with electrode 20B. Indeed, the electrode 20A is electrically isolated from electrode 20B. FIG. 5A also shows bonding area 20C. FIG. 5B schematically shows a top view, with the diaphragm 12 removed, of a similar embodiment having top side contact points, but no underpass 24A. Specifically, this figure shows the first and second electrodes 20A and 20B on the top surface of the substrate 14, and interface pads 26 for electrically connecting with external devices. Conductive traces 28 extending from the first and second electrodes 20A and 20B electrically connect the electrodes 20A and 20B with the pads 26. FIG. 5B also shows bonding area 20C.

Those in the art can use other techniques for electrically accessing the electrodes 20A and 20B. Accordingly, discussion of the above noted specific implementations is intended to be illustrative and thus, not limit various embodiments.

As noted above with reference to FIGS. 1A and 1B, those skilled in the art can apply illustrative embodiments to arrays of capacitive elements 10B. Each capacitive element 10B thus may be configured to generate and receive ultrasonic signals having different frequencies than those of the other capacitive elements 10B in the array. Alternatively, a single die 10 may have a first set of capacitive elements 10B for transmitting ultrasonic signals, and a second set of capacitive elements 10B for receiving ultrasonic signal. In yet other embodiments, a single die 10 may use all of its capacitive elements 10B for a single set of frequencies.

Figure 6:
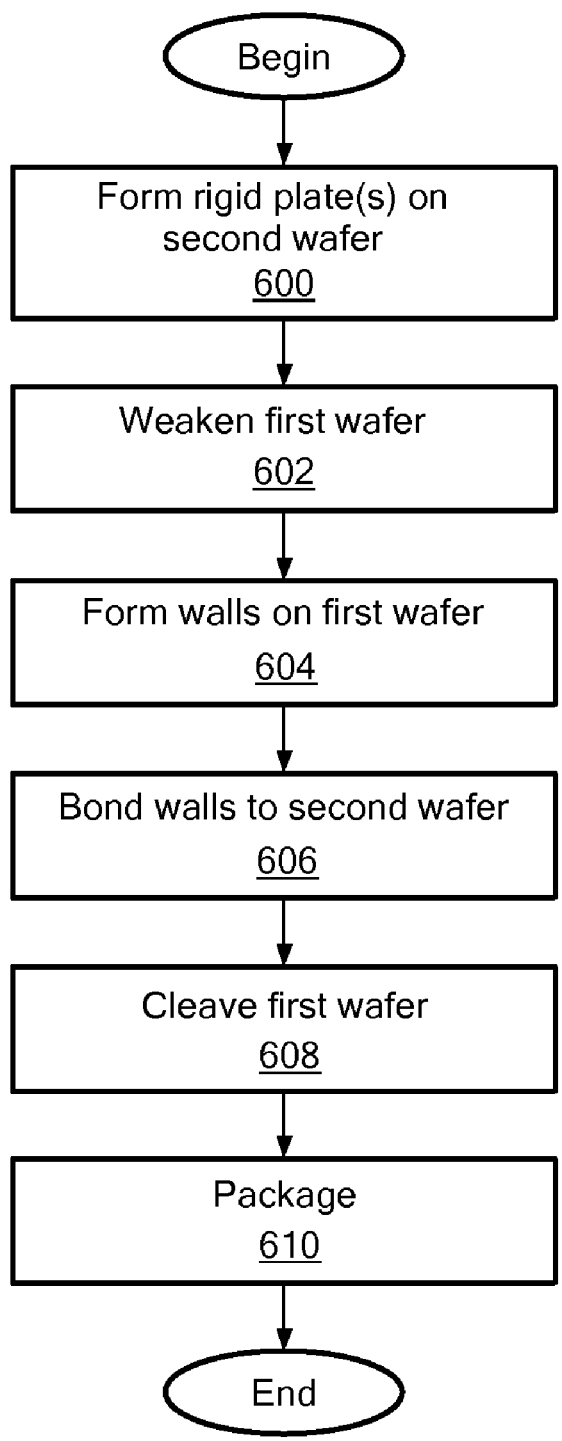
FIG. 6 shows a process of forming a MEMS device in accordance with illustrative embodiments of the invention.

FIG. 6 shows a process of forming a MEMS device (a capacitive element 10B in this embodiment to simplify this discussion) in accordance with illustrative embodiments of the invention. It should be noted that this process is a summary of a much longer process and thus, may omit certain steps. In addition, this process may perform some of the steps in an order that is different than that discussed. For example, certain steps may be implemented substantially simultaneously, or in a different order than that discussed.

It also should be noted that this process is discussed as fabricating a single MEMS device (in this case, a single capacitive element 10B). However, those skilled in the art can apply this process to batch processes, which simultaneously form a plurality of MEMS devices a on a single wafer, or arrays of single devices (e.g., acoustic elements or chips). Accordingly, the discussion concerning fabrication of a single MEMS device should not limit various embodiments, such as batch processing embodiments.

The process begins at step 600 by forming MEMS structure on a wafer using conventional micromachining techniques. This wafer, which has rigid plate(s) structure and is referred to herein as the "second wafer," forms the stationary plate 14 of the capacitive element 10B (among other things). A first wafer, which is discussed in the next step, forms the flexible MEMS diaphragm 12 of the capacitive element 10B.

As noted above with reference to FIG. 3 and other figures, this stationary plate 14 can include a portion of the substrate itself (e.g., a micromachined bottom plate 14 formed from silicon of a silicon substrate) and/or the deposited electrode 20B. The MEMS structure can include other structure, such as conductive traces, nitride insulating liners, vias, movable components, pads, or other MEMS components. The second wafer also can include on-chip circuitry.

The process continues to step 602, which weakens a first wafer (e.g., a silicon wafer). Specifically, the process implants/bombards the first wafer with an element. Consequently, the first wafer should have a weakened plane 30 that is substantially parallel to the top and bottom surfaces of the wafer. For example, the process may implant hydrogen or some other gas (e.g., oxygen) into the crystal lattice of the first wafer at a prescribed, uniform depth. As known by those skilled in the art, hydrogen should damage the crystal lattice of a single crystal silicon wafer.

This damaged portion thus should form a boundary between an upper portion of the wafer and a lower portion of the wafer. The upper portion ultimately will be discarded (see discussion below), while the lower portion will form part of the flexible diaphragm 12. The depth of the implant is a function of the ultimate goals of the capacitive element 10B. For example, some applications require diaphragms 12 having thicknesses of between about 1-3 microns. Other applications, however, may have thicker diaphragms 12, such as up to about 4, 5, 6, 7, 8, 10, 12, 13, 15, 17, or 20 microns. The depth of penetration for the implantation thus is dependent on the ultimate thickness of the diaphragm 12.

As noted, this weakening of the substrate (in this case, through implantation) effectively weakens the substrate material structure. This substrate may be considered to be a single layer of a single layer or multi-layer apparatus. For example, the substrate could be an uncoated, unprocessed bulk wafer (a single layer apparatus) of a single material, such as silicon. As such, the process weakens the structure of the wafer itself. As another example, the wafer could be a multi-layer apparatus and include a layer of oxide, metal, or some other material covering some part of one or both of its largest surfaces. This step nevertheless still weakens the wafer/substrate—the layer of the multi-layer apparatus that ultimately will become the primary structure of the diaphragm 12 (e.g., it will make up most of its thickness). This is in contrast to removing/weakening the oxide layer of a silicon-on-insulator wafer (itself a multi-layer apparatus).

After implanting hydrogen into the first wafer, the process forms the wall 16 on the first wafer (step 604). To that end, the process may use conventional micromachined processes to form the wall 16. For example, the process may deposit a layer of doped polysilicon, which then may be etched to form the wall 16.

Rather than forming it on the first wafer, the process may form the wall 16 on the second wafer (discussed immediately below). Accordingly, this step may form the wall 16 on either wafer. In addition, in some embodiments, the wall 16 may be considered to form the bottom plate 14.

Figure 7:
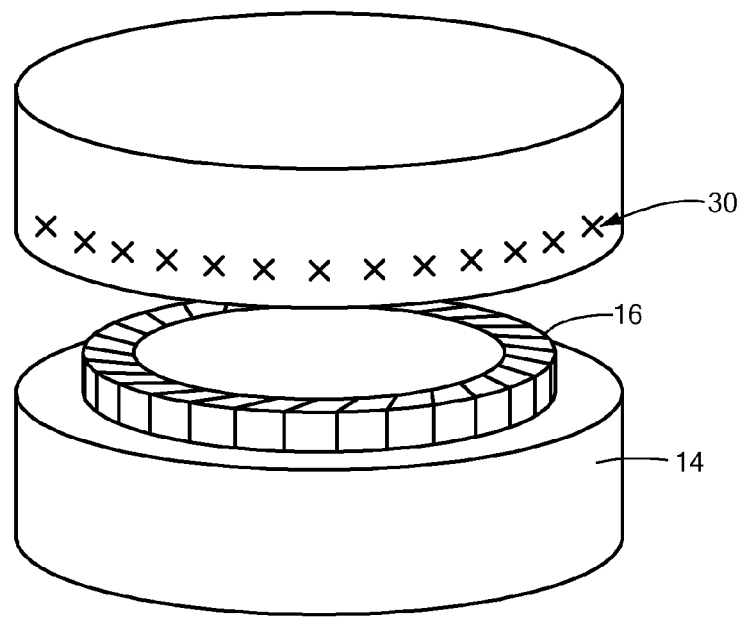
FIG. 7 schematically shows a perspective view of a capacitive micromachined ultrasonic transducer before its two wafers are bonded together.
Figure 8:
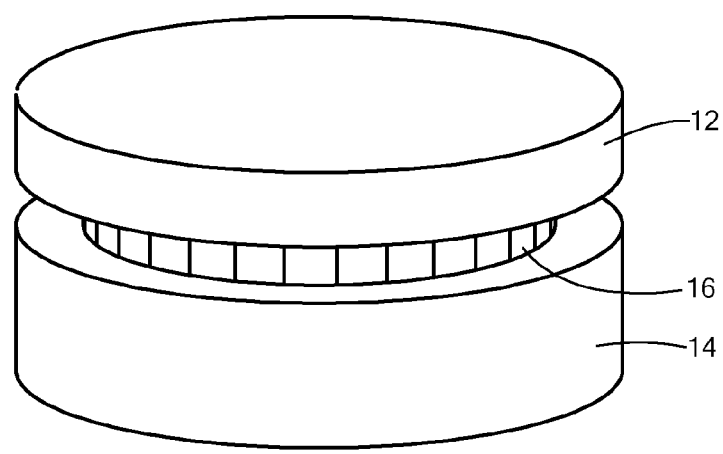
FIG. 8 schematically shows a perspective view of a capacitive micromachined ultrasonic transducer after its two wafers are bonded together.

The process then continues to step 606, which, using layer transfer processes, bonds the free ends of the wall 16 to the noted second wafer. FIGS. 7 and 8 schematically and respectively show steps 604 and 606. Specifically, FIG. 7 shows the two wafers before they are bonded, while FIG. 8 shows the two wafers bonded together. FIG. 7 shows the embodiment, however, with the wall 16 formed on the second wafer.

The wall 16 preferably is bonded to the other wafer at low temperatures (e.g., less than 400 degrees C.). For example, the conductive bond 22 can be formed from a metal, such as aluminum, aluminum germanium, copper, or some other material that can conductively bond the two components together. Accordingly, circuitry or other heat sensitive components on either substrate 14 should be substantially unaffected by the bonding process.

In addition, the two wafers are bonded within a vacuum chamber. The resulting closed chamber 18 within the wall 16 and plates 12 and 14 thus should also contain a substantial vacuum for appropriate operation.

After the two wafers are bonded together, the apparatus in its then present form has sufficient support to remove a portion of the first wafer; i.e., they separate the portion of the first wafer from the remainder. Accordingly, conventional processes cleave the weakened wafer along the weakened plane 30 to form a substantially uniform and thin diaphragm 12 (step 608). Other separation techniques may be used and thus, discussion of cleaving is one of a plurality of different techniques that the process could use.

As noted above, the diaphragm 12 is very thin—often much thinner than conventional wafers. Specifically, as discussed above, the thickness preferably is no greater than about 20 microns, and can be between about 1-20 microns, about 1-3 microns, about 1-5 microns, about 5-19 microns, etc. . . .

The excess portion of the cleaved wafer then is removed from the wafer and discarded. As noted above, this is the upper portion of the weakened wafer, which is above the boundary formed by the weakened layer. The process must use care when removing this upper portion to ensure that this step does not damage the portion of the weakened wafer (i.e., the diaphragm 12) remaining secured to the wall 16.

The process may then conclude at step 610 by packaging the resulting MEMS device. Any number of conventional packages should suffice. For example, conventional ceramic packages, leadframe packages (postmolded or premolded), flex packages, or substrate packages should suffice. Of course, they should be formed with access to the exterior environment.

It should be noted that some embodiments may singulate the capacitive elements 10B formed for batch processing. Thus, those embodiments may saw/cut/singulate the wafer before packaging.

The illustrative ultrasonic transducer/CMUT therefore beneficially has electrical connections on a single substrate 14, thus both simplifying the electrical connections required for the device and reducing manufacturing costs. In addition, the process does not require an expensive silicon-on-insulator wafer—instead, the process uses the substrate 14 as support for removing part of the weakened wafer, thus eliminating the need for an SOI wafer in the process.

Although the above discussion discloses various exemplary embodiments of the invention, it should be apparent that those skilled in the art can make various modifications that will achieve some of the advantages of the invention without departing from the true scope of the invention.

What is claimed is:

1. A method of producing a CMUT device, the method comprising:
providing a first substrate and a second substrate, the first substrate having a first interior surface and a thickness, the second substrate having a second interior surface, the first substrate being weakened in a plane generally parallel to the first interior surface;

forming at least one closed wall on at least one of the first and second substrates;

securing the first substrate to the second substrate, the at least one closed wall extending between the first interior surface and the second interior surface;

cleaving a portion of the first substrate along the plane generally parallel to the first interior surface after securing the first and second substrates, cleaving reducing the thickness of the first substrate of the CMUT device to no greater than about 20 microns; and removing an excess portion of the first substrate to produce the reduced thickness first substrate.

2. The method as defined by claim 1 wherein cleaving comprises cleaving the portion of the first substrate to reduce the thickness of the first substrate to no greater than about 5 microns.

3. The method as defined by claim 1 wherein the first substrate comprises at least one layer, the at least one layer including a given layer, the given layer including the first interior surface, the weakened plane being within the given layer.

4. The method as defined by claim 1 wherein the at least one closed wall forms a closed chamber with substantially a vacuum.

5. The method as defined by claim 1 wherein forming comprises forming a plurality of closed walls on at least one of the first and second substrates, the plurality of walls forming an array of CMUTs.

6. The method as defined by claim 5 further comprising:
forming a plurality of first plates on the first substrate, each of the plurality of first plates being defined by one of the plurality of walls; and
forming a plurality of second plates on the second substrate, each second plate forming a capacitive element with one of the first plates, the first plates being electrically isolated from the second plates.

7. The method as defined by claim 5 further comprising forming a plurality of electrical contacts on the second substrate to electrically interconnect with the first and second plates.

8. The method as defined by claim 1 wherein securing comprises electrically connecting the at least one closed wall with both the first interior surface and the second interior surface.

9. The method as defined by claim 1 further comprising forming first and second vias through the second substrate, electrically connecting the first via to the first substrate, electrically connecting the second via to the second substrate.

10. The method as defined by claim 1 further comprising:
forming a first plate on the first substrate;
forming a second plate on the second substrate, the first and second plates forming a capacitive element, the first and second plates being electrically isolated.

11. The method as defined by claim 10 wherein forming a second plate includes forming an insulative region around the second plate to isolate it from the first plate.

12. A method of producing a MEMS device, the method comprising:
providing a first substrate and a second substrate, the first substrate having a first interior surface and a thickness, the second substrate having a second interior surface and a micromachined second plate, the first substrate being weakened in a plane generally parallel to the first interior surface;

forming a plurality of walls on at least one of the first and second substrates;

securing the first substrate to the second substrate, the plurality of walls extending between the first interior surface and the second interior surface, each wall separating a first plate on the first substrate from the second plate on the second substrate, each first and second plate forming a capacitive element;

electrically isolating the first plate of each capacitive element from the second plate of its capacitive element;

separating, by cleaving, a portion of the first substrate along the plane generally parallel to the first interior surface after securing the first and second substrates, separating reducing the thickness of the first substrate to no greater than about 20 microns; and removing an excess portion of the first substrate to produce the reduced thickness first substrate.

13. The method as defined by claim 12 wherein a plurality of the capacitive elements form an array of CMUTs.

14. The method as defined by claim 12 further comprising forming a plurality of electrical contacts on the second substrate to electrically interconnect with the first and second plates.

15. The method as defined by claim 12 wherein securing comprises electrically connecting the at least one wall with both the first interior surface and the second interior surface.

16. The method as defined by claim 12 wherein separating reduces the thickness of the first substrate to between about 1 and about 3 microns.

17. The method as defined by claim 12 wherein securing comprises layer transferring the first substrate to the second substrate.

18. The method as defined by claim 12 further comprising dicing the first and second substrates to separate at least some of the capacitive elements.

19. The method as defined by claim 12 wherein a plurality of the capacitive elements have a sealed interior.

20. The method as defined by claim 12 wherein separating reduces the thickness of the first substrate to no greater than about 5 microns.

21. The method as defined by claim 12 wherein the capacitive elements comprise one or more of microphones, CMUTs, inertial sensors, and pressure sensors.

22. A method of producing a MEMS device, the method comprising:
providing a first substrate and a second substrate, the first substrate having a first interior surface and a thickness, the second substrate having a second interior surface and a micromachined second plate;

forming a plurality of walls on at least one of the first and second substrates;

weakening the first substrate in a plane generally parallel to the first interior surface to form a weakened first substrate;

securing the weakened first substrate to the second substrate, the plurality of walls extending between the first interior surface and the second interior surface, each wall separating a first plate on the weakened first substrate from the second plate on the second substrate, each first and second plate forming a capacitive element;

electrically isolating the first plate of each capacitive element from the second plate of its capacitive element;

cleaving a portion of the first substrate along the plane generally parallel to the first interior surface after securing the weakened first substrate and second substrate, cleaving reducing the thickness of the first substrate to no greater than about 20 microns; and removing an excess portion of the weakened first substrate to produce the reduced thickness first substrate.

23. The method as defined by claim 22 wherein cleaving comprises cleaving the first substrate in a plane generally parallel to the first interior surface to form the weakened first substrate.

* * * * *